United States Patent
Jia et al.

(10) Patent No.: US 10,355,053 B2
(45) Date of Patent: Jul. 16, 2019

(54) ORGANIC LIGHT-EMITTING DIODE, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenbin Jia, Beijing (CN); Li Sun, Beijing (CN); Xinwei Gao, Beijing (CN); Xiang Wan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/828,147

(22) Filed: Nov. 30, 2017

(65) Prior Publication Data
US 2018/0308905 A1    Oct. 25, 2018

(30) Foreign Application Priority Data

Apr. 21, 2017 (CN) .......................... 2017 1 0266107

(51) Int. Cl.
*H01L 27/32* (2006.01)
*H01L 51/50* (2006.01)

(52) U.S. Cl.
CPC ...... *H01L 27/3206* (2013.01); *H01L 27/3209* (2013.01); *H01L 51/504* (2013.01); *H01L 51/5004* (2013.01); *H01L 51/5044* (2013.01); *H01L 51/5064* (2013.01); *H01L 2251/552* (2013.01)

(58) Field of Classification Search
CPC .............................................. H01L 2251/5361
See application file for complete search history.

(56) References Cited

U.S. PATENT DOCUMENTS

| | | | |
|---|---|---|---|
| 2005/0280008 A1* | 12/2005 | Ricks | C09K 11/06 257/79 |
| 2014/0084256 A1 | 3/2014 | Kim et al. | |
| 2014/0118579 A1* | 5/2014 | Kim | H04N 9/045 348/242 |

FOREIGN PATENT DOCUMENTS

| | | |
|---|---|---|
| CN | 101022517 A | 8/2007 |
| CN | 102738399 A | 10/2012 |
| CN | 102751449 A | 10/2012 |

OTHER PUBLICATIONS

First Chinese Office Action, for Chinese Patent Application No. 201710266107.4, dated Jan. 22, 2018, 13 pages.

* cited by examiner

*Primary Examiner* — Thao P Le
(74) *Attorney, Agent, or Firm* — Kinney & Lange, P.A.

(57) ABSTRACT

Examples of the present disclosure provide an organic light-emitting diode, a display panel and a display device. This organic light-emitting diode includes a red light-emitting layer and a green light-emitting layer provided in a layer-built manner. The organic light-emitting diode also includes an exciton blocking layer, which is provided between the red light-emitting layer and the green light-emitting layer.

16 Claims, 4 Drawing Sheets

ORGANIC LIGHT-EMITTING DIODE, DISPLAY PANEL AND DISPLAY DEVICE

CROSS REFERENCE OF RELATED APPLICATION

The present application claims the priority of Chinese Patent Application No. 201710266107.4 filed on Apr. 21, 2017, which is incorporated herein in entirety by reference.

TECHNICAL FIELD

The present disclosure relates to the technical field of organic light-emitting diodes, in particular to an organic light-emitting diode, a display panel and a display device.

RELATED ART

Organic light-emitting diodes (OLEDs) has the prospect to be a new generation of display technology that may replace Thin Film Transistor Liquid Crystal Display (TFT-LCDs) due to many advantages, such as being capable of self light-emitting, being light and thin, having good color gamut, having low energy consumption, having possibility of being flexible, etc.

Currently, color representation of OLED displays may be achieved by providing a color filter (CF) on a surface of a white OLED (WOLED) device. The stability of the WOLED device is the precondition for mass production for OLEDs having large size. WOLEDs are typically composed of a blue light unit plus a yellow light unit (B+Y, wherein the yellow light unit may be composed of a red light-emitting layer and a green light-emitting layer) in series, or composed of a blue light unit plus a red/green light unit (B+R/G) in series. In order to complement the defect of the too quick attenuation of blue light, existing WOLEDs use a blue light unit plus a yellow light unit plus a blue light unit (B+Y+B) in series, or a blue light unit plus a red/green light unit plus a blue light unit (B+R/G+B) in series. At different current densities or different brightness, the color of light of a WOLED will somewhat shift. In spectrum, the color of light is also affected by the shift of the yellow light, in addition to shift of the blue light. Yellow light is formed by combining red light and green light. In related art, the change of the ratio of red light in a spectrum of a WOLED and that of green light are different to an extent. That is to say, red light and green light increase or decrease in different extents. This results in the color shift to an extent, and further affects the display effect. Meanwhile, crosstalk of the red excitons and green excitons to each other fluctuates relatively greatly with different current densities, which affects the luminescence efficiency of the device.

SUMMARY

In a first aspect, there is provided an organic light-emitting diode, comprising a red light-emitting layer and a green light-emitting layer provided in a layer-built manner, wherein the organic light-emitting diode further comprises an exciton blocking layer, which is provided between the red light-emitting layer and the green light-emitting layer.

Further, the exciton blocking layer is formed by doping a hole transport material with an electron transport material.

Further, and both of the triplet state T1 energy levels of the hole transport material and the electron transport material of the exciton blocking layer are higher than the triplet state T1 energy level of a host material of the red light-emitting layer by at least 0.6 eV, and both of the triplet state T1 energy levels of the hole transport material and the electron transport material of the exciton blocking layer are higher than the triplet state T1 energy level of a host material of the green light-emitting layer by at least 0.6 eV.

Further, the triplet state T1 energy levels of the hole transport material and the electron transport material of the exciton blocking layer are 2.5 eV to 6 eV.

Further, the HOMO energy level of the hole transport material of the exciton blocking layer matches both of the HOMO energy levels of host materials of the red light-emitting layer and the green light-emitting layer, and the LUMO energy level of the electron transport material of the exciton blocking layer matches both of the LUMO energy levels of host materials of the red light-emitting layer and the green light-emitting layer.

Further, the hole transport material accounts for 40% to 70% by mass in materials of the exciton blocking layer.

Further, the hole transport material comprises at least one of an aza-1,3,5-substituted-benzene-structure-based compound, a 9,9'-substituted 4,4'-difluorene-based derivative and a phosphoxyhydroanthracene di-triarylamine-based compound; and/or the electron transport material comprises at least one of a 9,9'-substituted 4,4'-difluorene-based derivative and a phosphoxyhydroanthracene di-triarylamine-based compound.

Further, the exciton blocking layer has a thickness of 20 Å to 200 Å.

Further, wherein the organic light-emitting diode further comprises a substrate, an anode layer, a hole injection layer, a first hole transport layer, a first electron transport layer, an electron injection layer and a cathode layer provided in a layer-built manner in this order; wherein the red light-emitting layer, the exciton blocking layer and the green light-emitting layer are provided sequentially between the first hole transport layer and the first electron transport layer, the red light-emitting layer is adjacent to the first hole transport layer, and the green light-emitting layer is adjacent to the first electron transport layer.

Further, the total thickness of the layers of the organic light-emitting diode except the substrate is 2000 Å to 4000 Å.

Further, the organic light-emitting diode further comprises a second hole transport layer, a first blue light-emitting layer, a second electron transport layer, a first N-charge generation layer and a first P-charge generation layer provided in a layer-built manner in this order, wherein the second hole transport layer is adjacent to the hole injection layer, and the first P-charge generation layer is adjacent to the first hole transport layer.

Further, the total thickness of the layers of the organic light-emitting diode except the substrate is 3000 Å to 7000 Å.

Further, the organic light-emitting diode further comprises a second N-charge generation layer, a second P-charge generation layer, a third hole transport layer, a second blue light-emitting layer and a third electron transport layer provided in a layer-built manner in this order, wherein the second N-charge generation layer is adjacent to the first electron transport layer, and the third electron transport layer is adjacent to the electron injection layer.

Further, the total thickness of the layers of the organic light-emitting diode except the substrate is 3000 Å to 7000 Å.

In a second aspect, there is provided a display panel comprising the organic light-emitting diode mentioned above.

In a third aspect, there is provided a display device comprising the display panel mentioned above.

DESCRIPTION OF DRAWINGS

In order to illustrate the technical solutions in examples of the present disclosure more clearly, figures required for describing the examples will be simply introduced below. It is apparent that the figures described below are merely exemplary examples of the present disclosure, and other figures may be further obtained by those of ordinary skill in the art according to these figures without exerting inventive work.

DESCRIPTION OF EMBODIMENTS

The technical solutions in the examples of the present disclosure will be described clearly and fully below in conjunction with specific embodiments of the present disclosure. Obviously, the examples described are merely a part of the examples of the present disclosure, rather than all of the examples. Based on the examples of the present disclosure, all other examples obtained by those of ordinary skill in the art without performing inventive work belong to the scope protected by the present disclosure.

Figure 1:
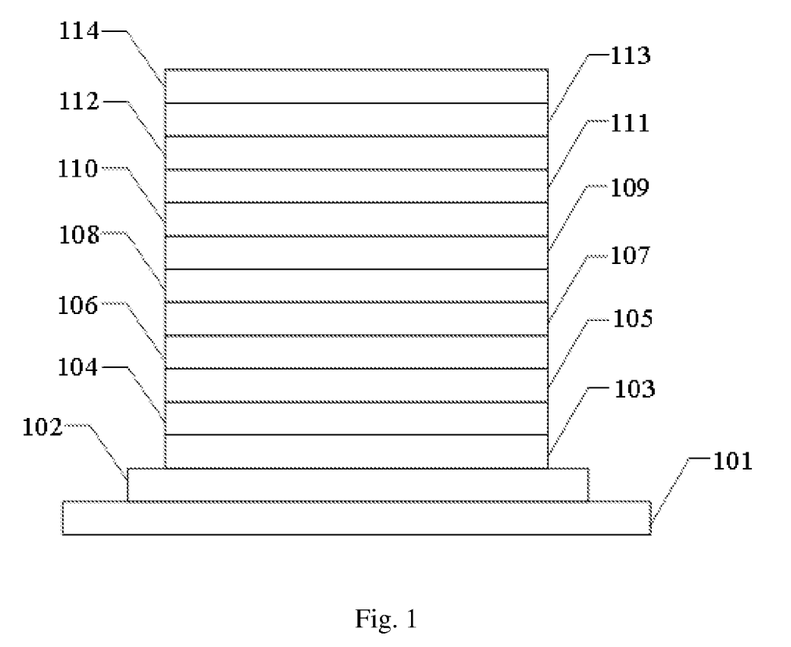
FIG. 1 is a schematic drawing of a structure of a WOLED in the related art.

At different current densities or different brightness, the color of light of a WOLED will somewhat shift. In spectrum, the color of light is affected by the shift of the blue light. In addition, the change of the ratio of red light in a spectrum and that of green light are different to an extent. That is to say, red light and green light increase or decrease in different extents. This results in the color shift to an extent, and further affects the display effect. On the basis of studying structures of WOLEDs, the inventor discovers the following matters. Firstly, as shown in FIG. 1, an WOLED comprises a substrate 101, an anode layer 102, a hole injection layer 103, a second hole transport layer 104, a blue light-emitting layer 105, a second electron transport layer 106, an N-charge generation layer 107, a P-charge generation layer 108, a first hole transport layer 109, a red light-emitting layer 110, a green light-emitting layer 111, a first electron transport layer 112, an electron injection layer 113 and a cathode layer 114 provided in a layer-built manner in this order.

Figure 2:
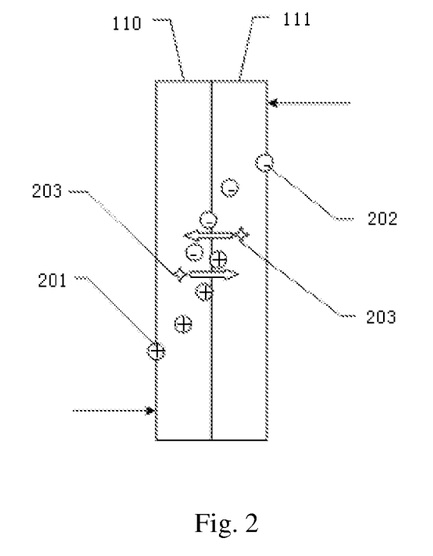
FIG. 2 is a schematic drawing of the state of excitons in a red light-emitting layer and a green light-emitting layer of a WOLED in the related art.

Further, the specific reason for changing of the color of light is shown in FIG. 2. At different current densities, a hole 201 and an electron 202 in the red light-emitting layer 110 will recombine to form an exciton 203, which tends to move to the green light-emitting layer 111, so as to increase the luminescence intensity in the green light-emitting layer 111. For the same reason, an exciton 203 in the green light-emitting layer 111 also tends to move to the red light-emitting layer 110, so as to increase the luminescence intensity in the red light-emitting layer 110. Such movement and crosstalk of excitons 203 result in instability of the color of light in the WOLED.

Figure 3:
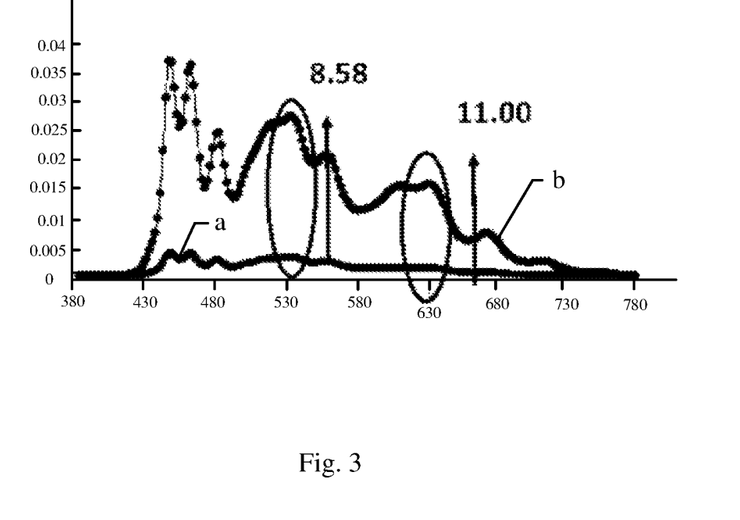
FIG. 3 is a spectrum of a WOLED in the related art at different current densities.

As shown in FIG. 3, the curve a represents the spectrum at a current density of 1 mA/cm$^2$, while the curve b represents the spectrum at a current density of 10 mA/cm$^2$. According to calculation, as the current density increases from 1 mA/cm$^2$ to 10 mA/cm$^2$, the factor of increase of the emission peak of red light is 11.00, while the factor of increase of the emission peak of green light is 8.58. The factor of increase of the emission peak of red light is different with that of the emission peak of green light. It indicates that the ratio of the excitons emitting red light to the excitons emitting green light changes, so that the yellow light composed somewhat shifts, which causes the white light composed shifts in turn. According to calculation, the changes of CIEx and CIEy of the device are 0.01 and −0.012, respectively. The display effect is thus affected. Meanwhile, crosstalk of the red excitons and green excitons to each other fluctuates relatively greatly with different current densities, which results in that the numbers of excitons in different light-emitting layers fluctuate relatively large, so that the luminescence intensities in corresponding light-emitting layers fluctuate relatively large, which affects the luminescence efficiency of the device. Additionally, with gradual aging of the device, the movement and crosstalk of excitons will be more notable. This makes the change of the color of light and change of the efficiency of the device at different current densities more notable, and therefore, the display effect is affected seriously.

On the basis of above, examples of the present disclosure provide an organic light-emitting diode and a display panel, to at least partially solve the color shift problem of organic light-emitting diodes in the related art.

Figure 4:
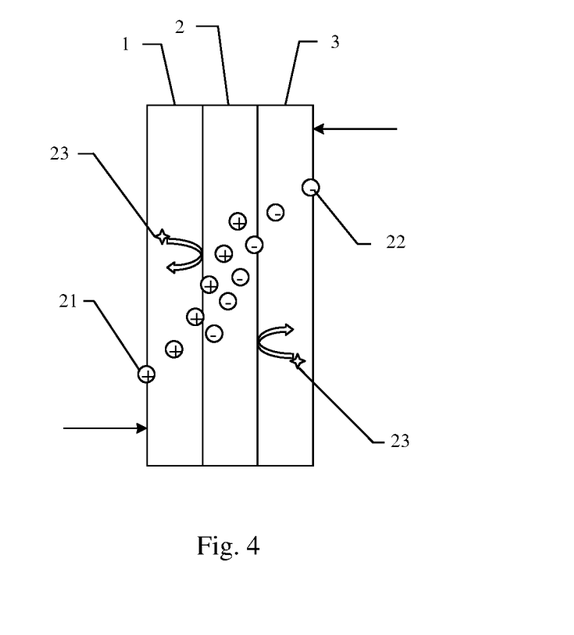
FIG. 4 is a schematic drawing of the state of excitons in a red light-emitting layer and a green light-emitting layer of an organic light-emitting diode according to an example of the present disclosure.

An example of the present disclosure discloses an organic light-emitting diode. As shown in FIG. 4, the organic light-emitting diode comprises a red light-emitting layer 1, an exciton blocking layer 2 and a green light-emitting layer 3 provided in a layer-built manner, wherein an exciton blocking layer 2 is provided between the red light-emitting layer 1 and the green light-emitting layer 3.

This exciton blocking layer 2 limits excitons 23 in the red light-emitting layer 1 and the green light-emitting layer 3, respectively, so that the movement and crosstalk of excitons 23 are prevented, and thus increase or decrease of excitons 23 in the red light-emitting layer 1 and the green light-emitting layer 3. Thus, with changes of the current density, the extent of increase or decrease of the emission peak of red light and that of green light are close, so that the proportion between the light intensities of the both is stable, and thus the color of the light composed of the both is relatively stable. Meanwhile, since the number of excitons 23 in the red light-emitting layer 1 and that in the green light-emitting layer 3 affect the luminescence efficiency, the luminescence efficiency of the organic light-emitting diode would not fluctuate greatly due to the crosstalk between the excitons 23 of the red light-emitting layer 1 and the excitons 23 of the green light-emitting layer 3, by means of providing an exciton blocking layer 2 to isolate the excitons 23.

Particularly, an exciton blocking layer 2 is formed by doping a hole transport material with an electron transport material. In the red light-emitting layer 1 and the green light-emitting layer 3, host material generally accounts for 90% or more of the material of the red light-emitting layer 1 or the green light-emitting layer 3.

Therefore, in order to achieve the function of isolating excitons 23, optionally, both of the triplet state T1 energy levels of the hole transport material and the electron transport material of the exciton blocking layer 2 are higher than the triplet state T1 energy level of a host material of the red light-emitting layer 1 by at least 0.6 eV, and both of the triplet state T1 energy levels of the hole transport material and the electron transport material of the exciton blocking layer 2 are higher than the triplet state T1 energy level of a host material of the green light-emitting layer 3 by at least 0.6 eV.

Since energy generally is transported from high energy to low energy, when both of the triplet state T1 energy levels of the hole transport material and the electron transport material of the exciton blocking layer 2 are higher than the triplet state T1 energy level of the host material of the red light-emitting layer 1 and the triplet state T1 energy level of the host material of the green light-emitting layer 3 by at least 0.6 eV, excitons 23 would not move at the interface between the red light-emitting layer 1 and the exciton blocking layer 2, and excitons 23 would not move at the interface between the green light-emitting layer 3 and the exciton blocking layer 2, either. Therefore, the numbers of excitons 23 in the red light-emitting layer 1 and the green light-emitting layer 3 are stable. With changes of the current density, the extent of increase or decrease of the emission peak of red light and that of green light are close, so that the color of the yellow light composed of the both is relatively stable. Meanwhile, it also results in a relatively stable luminescence efficiency of the organic light-emitting diode.

In particular, the triplet state T1 energy levels of the hole transport material and the electron transport material of the exciton blocking layer 2 are 2.5 eV to 6 eV. It is beneficial for the function of isolating excitons 23 that relatively high triplet state T1 energy levels of the hole transport material and the electron transport material of the exciton blocking layer 2 may be ensured.

The exciton blocking layer 2 has to have the function of transport holes 21 and electrons 22, in order to form excitons 23 by the recombination of holes 21 and electrons 22 in the red light-emitting layer 1 and the green light-emitting layer 3, respectively. Holes 21 are transported at the highest occupied molecular orbital (HOMO) and electrons 22 are transported at the lowest unoccupied molecular orbital (LUMO). Hence, in order to facilitate the transport of holes 21 and electrons 22 in the exciton blocking layer 2, the HOMO energy level of the hole transport material of the exciton blocking layer 2 matches both of the HOMO energy levels of the host materials of the red light-emitting layer 1 and the green light-emitting layer 3. Thus, the potential barrier between the exciton blocking layer 2 and the red light-emitting layer 1, as well as the potential barrier between the exciton blocking layer 2 and the green light-emitting layer 3, are relatively small, so as to facilitate the transport of holes 21 between the exciton blocking layer 2 and the red light-emitting layer 1 and the transport of holes 21 between the exciton blocking layer 2 and the green light-emitting layer 3. The LUMO energy level of the electron transport material of the exciton blocking layer 2 matches both of the LUMO energy levels of the host materials of the red light-emitting layer 1 and the green light-emitting layer 3. Thus, the potential barrier between the exciton blocking layer 2 and the red light-emitting layer 1, as well as the potential barrier between the exciton blocking layer 2 and the green light-emitting layer 3, are relatively small, so as to facilitate the transport of electrons 22 between the exciton blocking layer 2 and the red light-emitting layer 1 and the transport of electrons 22 between the exciton blocking layer 2 and the green light-emitting layer 3. The match of energy levels is not limited in a certain range. On the basis of different materials and current intensities, the potential barrier between the layers, which should be overcome during transport of holes 21 or electrons 22, may be different. Therefore, the difference between the energy levels of the corresponding materials of the layers may be also different.

Optionally, the hole transport material accounts for 40% to 70% by mass in materials of the exciton blocking layer 2. This further ensures that the exciton blocking layer 2 may transport holes 21 and electrons 22. Thus, holes 21 and electrons 22 may form excitons 23 by the recombination in the red light-emitting layer 1 and the green light-emitting layer 3, respectively.

The hole transport material and the electron transport material of the exciton blocking layer 2 need relatively high triplet state T1 energy levels. Therefore, optionally, the hole transport material of the exciton blocking layer 2 comprises at least one of an aza-1,3,5-substituted-benzene-structure-based compound, a 9,9'-substituted 4,4'-difluorene-based derivative and a phosphoxyhydroanthracene di-triarylamine-based compound. The electron transport material of the exciton blocking layer 2 comprises at least one of a 9,9'-substituted 4,4'-difluorene-based derivative and a phosphoxyhydroanthracene di-triarylamine-based compound. The above-mentioned hole transport materials and electron transport materials of the exciton blocking layer 2 ensure the function of the exciton blocking layer 2 for transporting holes 21 and electrons 22, and meanwhile, have the function of isolate excitons 23 in the red light-emitting layer 1 and the green light-emitting layer 3 because of their own high triplet state T1 energy level. Some examples of the aza-1,3,5-substituted-benzene-structure-based compound are described in Chinese Patent Application No. 106243057 Å. Some examples of the 9,9'-substituted 4,4'-difluorene-based derivative are described in Chinese Patent Application No. 104326980 Å. Some examples of the phosphoxyhydroanthracene di-triarylamine-based compound are described in Chinese Patent Application No. 103183710 Å.

In particular, the exciton blocking layer 2 has a thickness of 20 Å to 150 Å. Optionally, the exciton blocking layer 2 has a thickness of 50 Å. The thickness mentioned above may prevent negative effects on the organic light-emitting diode caused by that the exciton blocking layer 2 is too thin or too thick.

Thus, in examples of the present disclosure, excitons 23 are limited in the red light-emitting layer 1 and the green light-emitting layer 3 by providing the exciton blocking layer 2, so that the movement and crosstalk of excitons are prevented, and thus increase or decrease of excitons in the red light-emitting layer and the green light-emitting layer. Thus, with changes of the current density, the extent of increase or decrease of the emission peak of red light and that of green light are close, so that the proportion between the light intensities of the both is stable, and thus the color of the light composed of the both is relatively stable. Thereby, the luminescence efficiency of the organic light-emitting diode is also relatively stable.

The organic light-emitting diode of the present disclosure will be further described below by specific Examples.

EXAMPLES

Figure 5:
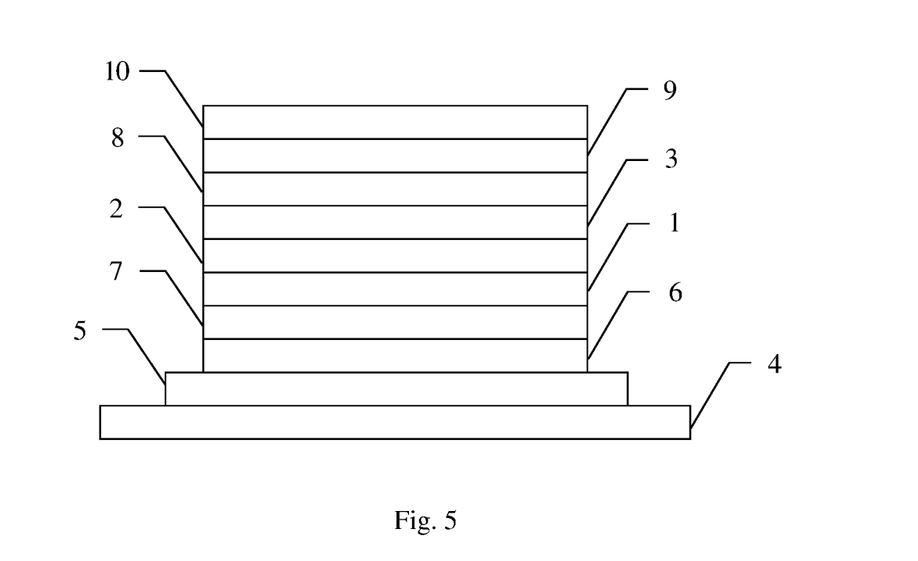
FIG. 5 is a schematic drawing of the structure of the organic light-emitting diode of the example 1 of the present disclosure.

In an example, an organic light-emitting diode may be an organic light-emitting diode emitting yellow light. As shown in FIGS. 4 and 5, this organic light-emitting diode comprises the following structure: a substrate 4, an anode layer 5, a hole injection layer 6, a first hole transport layer 7, a red light-emitting layer 1, an exciton blocking layer 2, a green light-emitting layer 3, a first electron transport layer 8, an electron injection layer 9 and a cathode layer 10 provided in a layer-built manner in this order.

The anode layer 5 may use ITO. The red light-emitting layer 1 and the green light-emitting layer 3 may be a host material doped with a phosphorescent material or a fluorescent material. In this example, a phosphorescent material is preferable, because it may have relatively high photoelectric conversion efficiency under the precondition that the use life is ensured.

Optionally, in order to ensure the luminescence efficiency of the organic light-emitting diode of this example, the total thickness of the layers of the organic light-emitting diode except the substrate 4 is 2000 Å to 4000 Å.

Particularly, the operational principle of the organic light-emitting diode of this example is as follows.

When a current is on state between the anode layer 5 and the cathode layer 10, the cathode layer 10 produces electrons 22 and they are transported towards the direction of the anode layer 5, while the anode layer 5 provides holes 21 and they are transported towards the direction of the cathode layer 10. These holes 21 and electrons 22 meet each other in the red light-emitting layer 1 or the green light-emitting layer 3, and form excitons 23 by recombination. The energy of an exciton 23 in the red light-emitting layer 1 are transported to the guest dopant molecular in the red light-emitting layer 1 by the energy transfer between the host and the guest, so that an electron in the dopant molecule at the ground state is excited to excited states S1 (singlet state) and T1 (triplet state). The molecule at the excited state is unstable, and goes back to the ground state by the manner of radiative transition, releases energy and emits red light. In the same manner, the green light-emitting layer 3 emits green light. A yellow light is formed by combining the red light and the green light. In order to obtain a yellow light with stable color of light, the ratio of the light intensities of the red light and the green light should be stable. Therefore, the movement and crosstalk of excitons 23 between the red light-emitting layer 1 and the green light-emitting layer 3 may be avoided by providing the exciton blocking layer 2. The numbers of excitons 23 in the red light-emitting layer 1 and the green light-emitting layer 3 are thereby stable. Thus, at different current densities, the extents of increase or decrease of the emission peak of the both are the same, so that the ratio of the light intensities of the both is stable. Color shift would not occur once the colors of light are blended. The luminescence efficiency thereof will not fluctuate greatly due to the crosstalk of the excitons 23 of red light-emitting layer 1 and the excitons 23 of the green light-emitting layer 3, either.

Figure 6:
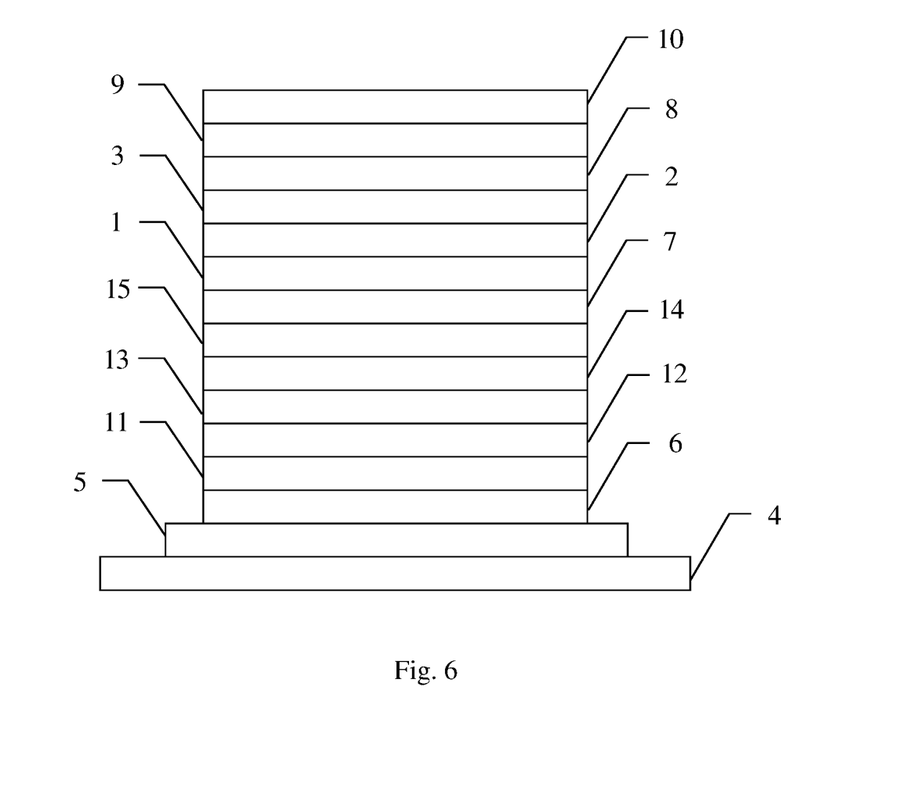
FIG. 6 is a schematic drawing of the structure of the organic light-emitting diode of the example 2 of the present disclosure.

In another example, the organic light-emitting diode is a series-type white light organic light-emitting diode. As shown in FIGS. 4 and 6, this organic light-emitting diode comprises a substrate 4, an anode layer 5, a hole injection layer 6, a second hole transport layer 11, a first blue light-emitting layer 12, a second electron transport layer 13, a first N-charge generation layer 14 and a first P-charge generation layer 15, a first hole transport layer 7, a red light-emitting layer 1, an exciton blocking layer 2, a green light-emitting layer 3, a first electron transport layer 8, an electron injection layer 9 and a cathode layer 10 provided in a layer-built manner. Optionally, a first electron blocking layer may be provided between the second hole transport layer 11 and the first blue light-emitting layer 12, in order to suppress overflow of electrons, so as to increase the chance of forming excitons in the first blue light-emitting layer 12 and increase the luminescence efficiency of blue light.

The anode layer 5 may use ITO. For the first blue light-emitting layer 12, a fluorescent material has a longer life than a phosphorescent material. Therefore, in this example, the first blue light-emitting layer 12 preferably uses a fluorescent material. In this example, the red light-emitting layer 1 and the green light-emitting layer 3 preferably use phosphorescent material, because it has relatively high photoelectric conversion efficiency under the precondition that the use life is ensured.

Optionally, in order to ensure the luminescence efficiency of the organic light-emitting diode, the total thickness of the layers of the organic light-emitting diode except the substrate 4 is 3000 Å to 7000 Å.

Particularly, the operational principle of the organic light-emitting diode is as follows.

When a current is on state between the anode layer 5 and the cathode layer 10, the first N-charge generation layer 14 produces electrons 22 and they are transported towards the direction of the anode layer 5, while the anode layer 5 provides holes 21 and they are transported towards the direction of the cathode layer 10. These holes 21 and electrons 22 meet each other in first blue light-emitting layer 12, and form excitons 23 by recombination. The energy of an exciton 23 are transported to the guest dopant molecular in the first blue light-emitting layer 12 by the energy transfer between the host and the guest, so that an electron in the dopant molecule at the ground state is excited to excited states S1 (singlet state) and T1 (triplet state) (mainly excited states S1 in fluorescence). The molecule at the excited state is unstable, and goes back to the ground state by the manner of radiative transition, releases energy and emits blue light. Meanwhile, the first P-charge generation layer 15 provides holes 21 and they are transported towards the direction of the cathode layer 10, while the cathode layer 10 produces electrons 22 and they are transported towards the direction of the anode layer 5. These holes 21 and electrons 22 meet each other in the red light-emitting layer 1 or the green light-emitting layer 3, and form excitons 23 by recombination. The energy of an exciton 23 in the red light-emitting layer 1 are transported to the guest dopant molecular in the red light-emitting layer 1 by the energy transfer between the host and the guest, so that an electron in the dopant molecule at the ground state is excited to excited states S1 (singlet state) and T1 (triplet state). The molecule at the excited state is unstable, and goes back to the ground state by the manner of radiative transition, releases energy and emits red light. In the same manner, the green light-emitting layer 3 emits green light. A yellow light is formed by combining the red light and the green light. And a white light is formed by combining the yellow light and the blue light. In order to obtain a white light with stable color of light, the ratio of the light intensities of the red light, the green light and the blue light should be stable. Therefore, the movement and crosstalk of excitons 23 between the red light-emitting layer 1 and the green light-emitting layer 3 may be avoided by providing the exciton blocking layer 2. The numbers of excitons 23 in the red light-emitting layer 1 and the green light-emitting layer 3 are thereby stable. Thus, at different current densities, the extents of increase or decrease of the emission peak of the both are the same, so that the ratio of the light intensities of the both is stable. Color shift would not occur once the colors of light are blended. The luminescence efficiency thereof will not fluctuate greatly due to the crosstalk of the excitons 23 of red light-emitting layer 1 and the excitons 23 of the green light-emitting layer 3, either.

Figure 7:
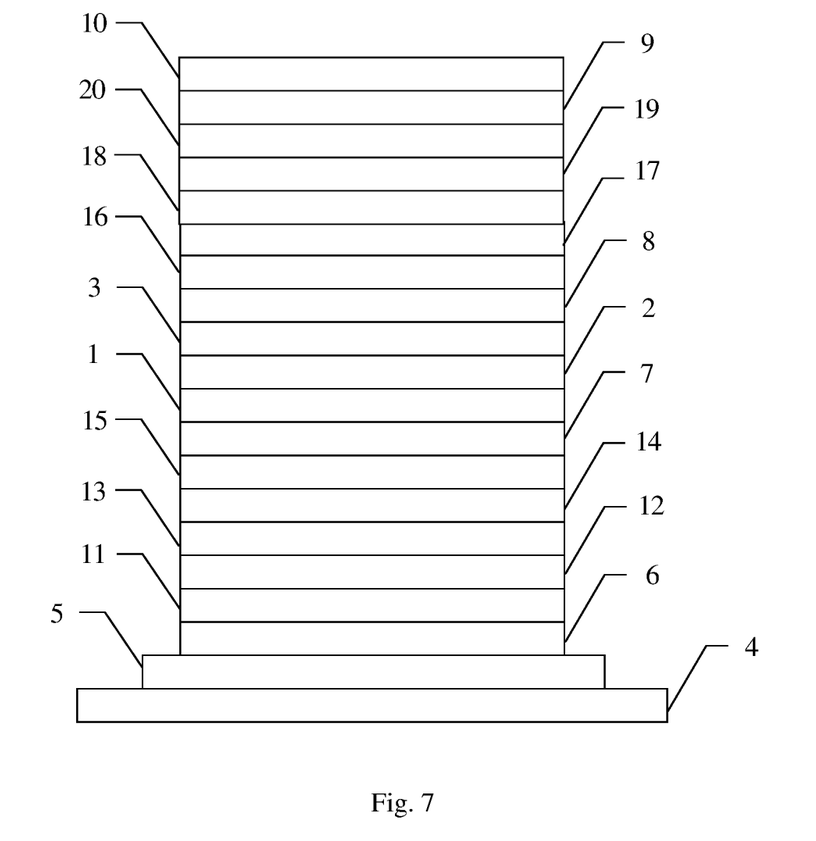
FIG. 7 is a schematic drawing of the structure of the organic light-emitting diode of the example 3 of the present disclosure.

In still another example, this organic light-emitting diode is a series-type white light organic light-emitting diode. As shown in FIGS. 4 and 7, this organic light-emitting diode comprises a substrate 4, an anode layer 5, a hole injection layer 6, a second hole transport layer 11, a first blue light-emitting layer 12, a second electron transport layer 13, a first N-charge generation layer 14, a first P-charge generation layer 15, a first hole transport layer 7, a red light-emitting layer 1, an exciton blocking layer 2, a green light-emitting layer 3, a first electron transport layer 8, a second N-charge generation layer 16, a second P-charge generation layer 17, a third hole transport layer 18, a second blue light-emitting layer 19, a third electron transport layer 20, an electron injection layer 9 and a cathode layer 10 provided in a layer-built manner. Optionally, a first electron blocking layer may be provided between the second hole transport layer 11 and the first blue light-emitting layer 12, and a second electron blocking layer may be provided between the third hole transport layer 18 and the second blue light-emitting layer 19, in order to suppress overflow of electrons, so as to increase the chance of forming excitons in the first blue light-emitting layer 12 and the second blue light-emitting layer 19 and increase the luminescence efficiency of blue light.

The anode layer 5 may use ITO. As in the example above, the first blue light-emitting layer 12 and the second blue light-emitting layer 19 of this example preferably use fluorescent material, and the red light-emitting layer 1 and the green light-emitting layer 3 preferably use phosphorescent material.

Optionally, in order to ensure the luminescence efficiency of the organic light-emitting diode, the total thickness of the layers of the organic light-emitting diode except the substrate 4 is 3000 Å to 7000 Å.

Particularly, the operational principle of the organic light-emitting diode is as follows.

When a current is on state between the anode layer 5 and the cathode layer 10, the first N-charge generation layer 14 produces electrons 22 and they are transported towards the direction of the anode layer 5, while the anode layer 5 provides holes 21 and they are transported towards the direction of the cathode layer 10. These holes 21 and electrons 22 meet each other in first blue light-emitting layer 12, and form excitons 23 by recombination. The energy of an exciton 23 are transported to the guest dopant molecular in the first blue light-emitting layer 12 by the energy transfer between the host and the guest, so that an electron in the dopant molecule at the ground state is excited to excited states S1 (singlet state) and T1 (triplet state) (mainly excited states S1 in fluorescence). The molecule at the excited state is unstable, and goes back to the ground state by the manner of radiative transition, releases energy and emits blue light. In a similar way, the second P-charge generation layer 18 provides holes 21 and they are transported towards the direction of the cathode layer 10, while the cathode layer 10 produces electrons 22 and they are transported towards the direction of the anode layer 5. These holes 21 and electrons 22 meet each other in the second blue light-emitting layer 19, and form excitons 23 by recombination, and finally a blue light is emitted. Meanwhile, the first P-charge generation layer 15 provides holes 21 and they are transported towards the direction of the cathode layer 10, while the second N-charge generation layer 16 produces electrons 22 and they are transported towards the direction of the anode layer 5. These holes 21 and electrons 22 meet each other in the red light-emitting layer 1 or the green light-emitting layer 3, and form excitons 23 by recombination. The energy of an exciton 23 in the red light-emitting layer 1 are transported to the guest dopant molecular in the red light-emitting layer 1 by the energy transfer between the host and the guest, so that an electron in the dopant molecule at the ground state is excited to excited states S1 (singlet state) and T1 (triplet state). The molecule at the excited state is unstable, and goes back to the ground state by the manner of radiative transition, releases energy and emits red light. In the same manner, the green light-emitting layer 3 emits green light. A yellow light is formed by combining the red light and the green light. And a white light is formed by combining the yellow light and the blue light emitted from the first blue light-emitting layer 12 and the second blue light-emitting layer 19. In order to obtain a white light with stable color of light, the ratio of the light intensities of the red light, the green light and the blue light should be stable. Therefore, the movement and crosstalk of excitons 23 between the red light-emitting layer 1 and the green light-emitting layer 3 may be avoided by providing the exciton blocking layer 2. The numbers of excitons 23 in the red light-emitting layer 1 and the green light-emitting layer 3 are thereby stable. Thus, at different current densities, the extents of increase or decrease of the emission peak of the both are the same, so that the ratio of the light intensities of the both is stable. Color shift would not occur once the colors of light are blended. The luminescence efficiency thereof will not fluctuate greatly due to the crosstalk of the excitons 23 of red light-emitting layer 1 and the excitons 23 of the green light-emitting layer 3, either.

To sum up, in the organic light-emitting diodes of the examples of present disclosure, the exciton blocking layer 2 is provided to limit excitons 23 in the red light-emitting layer 1 and the green light-emitting layer 3, respectively, so that the movement and crosstalk of excitons 23 are prevented, and thus increase or decrease of excitons in the red light-emitting layer 1 and the green light-emitting layer 3. Thus, with changes of the current density, the extent of increase or decrease of the emission peak of red light and that of green light are close, so that the color of the light composed of the both is relatively stable. The luminescence efficiency would not fluctuate greatly due to the crosstalk between the excitons 23 of the red light-emitting layer 1 and the excitons 23 of the green light-emitting layer 3. Further, the relations between the triplet state T1 energy levels, the HOMO energy levels and the LUMO energy levels of the host material of the red light-emitting layer 1, the hole transport material and the electron transport material of the exciton blocking layer 2 and the host material of the green light-emitting layer 3. Thereby, it is ensured that the exciton blocking layer isolates the excitons 23, and meanwhile will not affect the normal transport of holes 21 and electrons 22, so that holes 21 and electrons 22 may meet at different light-emitting layers and form excitons 23 by recombination.

Examples of the present disclosure also provide a display panel. The display panel comprises an organic light-emitting diode in any of above-mentioned examples. Therefore, the display panel has relatively stable color of light and luminescence efficiency, and represents better display effects.

The examples in the present specification are described in a progressive relation. Each example focuses on differences with respect to other examples. The similar parts of the examples may be referred to each other.

Although preferable embodiments of this disclosure have been described, additional alterations and modifications may be made to these embodiments once the person skilled in the art knows the basic inventive concept. Therefore, the appended claims are intended to be construed to comprise preferable embodiments and all alterations and modifications falling in the scope of the embodiments of this disclosure.

Finally, it is to be further indicated that relational terms such as first, second, and the like are merely to distinguish one entity or operation from another entity or operation, and it does not necessarily require or imply that there is any actual relation or order between these entities and operations. Additionally, terms "include", "comprise", or any other variant, intends to cover nonexclusive inclusion, such that a process, method, article, or terminal device comprising a range of elements comprises not only those elements, but also other elements which are not specifically listed or elements intrinsically possessed by this process, method, article, or terminal device. In absence of more limitations, an element defined by a sentence "comprise a" does not exclude that there is additionally the same element in a process, method, article, or terminal device comprising this element.

Particular embodiments of the present disclosure are described above. However, the protection scope of the present disclosure is not limited thereto. Any modification or alteration that may be easily envisaged by a person skilled in the art in the disclosed technology should be included in the protection scope of the present disclosure. Therefore, the protection scope of the present disclosure should be the protection scope of claims.

What is claimed is:

1. An organic light-emitting diode, comprising a red light-emitting layer and a green light-emitting layer provided in a layer-built manner, wherein the organic light-emitting diode further comprises an exciton blocking layer, which is provided between the red light-emitting layer and the green light-emitting layer.

2. The organic light-emitting diode according to claim 1, wherein the exciton blocking layer is formed by doping a hole transport material with an electron transport material.

3. The organic light-emitting diode according to claim 2, wherein both of the triplet state T1 energy levels of the hole transport material and the electron transport material of the exciton blocking layer are higher than the triplet state T1 energy level of a host material of the red light-emitting layer by at least 0.6 eV, and both of the triplet state T1 energy levels of the hole transport material and the electron transport material of the exciton blocking layer are higher than the triplet state T1 energy level of a host material of the green light-emitting layer by at least 0.6 eV.

4. The organic light-emitting diode according to claim 3, wherein the triplet state T1 energy levels of the hole transport material and the electron transport material of the exciton blocking layer are 2.5 eV to 6 eV.

5. The organic light-emitting diode according to claim 2, wherein the HOMO energy level of the hole transport material of the exciton blocking layer matches both of the HOMO energy levels of host materials of the red light-emitting layer and the green light-emitting layer, and the LUMO energy level of the electron transport material of the exciton blocking layer matches both of the LUMO energy levels of host materials of the red light-emitting layer and the green light-emitting layer.

6. The organic light-emitting diode according to claim 2, wherein the hole transport material accounts for 40% to 70% by mass in materials of the exciton blocking layer.

7. The organic light-emitting diode according to claim 2, wherein
the hole transport material comprises at least one of an aza-1,3,5-substituted-benzene-structure-based compound, a 9,9'-substituted 4,4'-difluorene-based derivative and a phosphoxyhydroanthracene di-triarylamine-based compound; and/or
the electron transport material comprises at least one of a 9,9'-substituted 4,4'-difluorene-based derivative and a phosphoxyhydroanthracene di-triarylamine-based compound.

8. The organic light-emitting diode according to claim 1, wherein the exciton blocking layer has a thickness of 20 Å to 200 Å.

9. The organic light-emitting diode according to claim 1, wherein the organic light-emitting diode further comprises a substrate, an anode layer, a hole injection layer, a first hole transport layer, a first electron transport layer, an electron injection layer and a cathode layer provided in a layer-built manner in this order; wherein the red light-emitting layer, the exciton blocking layer and the green light-emitting layer are provided sequentially between the first hole transport layer and the first electron transport layer, the red light-emitting layer is adjacent to the first hole transport layer, and the green light-emitting layer is adjacent to the first electron transport layer.

10. The organic light-emitting diode according to claim 9, wherein the total thickness of the layers of the organic light-emitting diode except the substrate is 2000 Å to 4000 Å.

11. The organic light-emitting diode according to claim 9, wherein the organic light-emitting diode further comprises a second hole transport layer, a first blue light-emitting layer, a second electron transport layer, a first N-charge generation layer and a first P-charge generation layer provided in a layer-built manner in this order, wherein the second hole transport layer is adjacent to the hole injection layer, and the first P-charge generation layer is adjacent to the first hole transport layer.

12. The organic light-emitting diode according to claim 11, wherein the total thickness of the layers of the organic light-emitting diode except the substrate is 3000 Å to 7000 Å.

13. The organic light-emitting diode according to claim 11, wherein the organic light-emitting diode further comprises a second N-charge generation layer, a second P-charge generation layer, a third hole transport layer, a second blue light-emitting layer and a third electron transport layer provided in a layer-built manner in this order, wherein the second N-charge generation layer is adjacent to the first electron transport layer, and the third electron transport layer is adjacent to the electron injection layer.

14. The organic light-emitting diode according to claim 13, wherein the total thickness of the layers of the organic light-emitting diode except the substrate is 3000 Å to 7000 Å.

15. A display panel, comprising the organic light-emitting diode of claim 1.

16. A display device, comprising the display panel of claim 15.

* * * * *